(12) United States Patent
Cho et al.

(10) Patent No.: US 10,505,117 B2
(45) Date of Patent: Dec. 10, 2019

(54) ORGANIC LIGHT EMITTING DIODE DEVICE

(71) Applicant: SAMSUNG DISPLAY CO., LTD., Yongin, Gyeonggi-Do (KR)

(72) Inventors: Se-Jin Cho, Yongin (KR); Chang-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 896 days.

(21) Appl. No.: 14/298,788

(22) Filed: Jun. 6, 2014

(65) Prior Publication Data

US 2015/0001498 A1 Jan. 1, 2015

(30) Foreign Application Priority Data

Jun. 28, 2013 (JP) .................. 10-2013-0075118

(51) Int. Cl.
*H01L 51/00* (2006.01)
*H01L 51/50* (2006.01)

(52) U.S. Cl.
CPC ...... *H01L 51/0054* (2013.01); *H01L 51/0058* (2013.01); *H01L 51/0067* (2013.01);
(Continued)

(58) Field of Classification Search
CPC . H01L 33/42; H01L 51/0054; H01L 51/0058; H01L 51/0067; H01L 51/0072;
(Continued)

(56) References Cited

U.S. PATENT DOCUMENTS 9,412,951 B2 * 8/2016 Qiu .................. H01L 51/0052
9,768,387 B2 * 9/2017 Choi ................ H01L 51/0058
(Continued)

FOREIGN PATENT DOCUMENTS

JP 2007-507107 A 3/2007
JP 2007-191603 A * 8/2007
(Continued)

OTHER PUBLICATIONS

Machine translation of KR 10-2006-0074258 (publication date Jul. 2006).*

(Continued)

*Primary Examiner* — Dawn L Garrett
(74) *Attorney, Agent, or Firm* — Lewis Roca Rothgerber Christie LLP (57) ABSTRACT

An organic light emitting diode device includes a first electrode, a second electrode, an organic emission layer, an electron transport layer and a buffer layer. The second electrode is opposite to the first electrode. The organic emission layer is located between the first and second electrodes. The electron transport layer is located between the organic emission layer and the second electrode. The buffer layer is located between the organic emission layer and the electron transport layer, and is made of at least one material selected from a pyrene compound represented by the following Chemical Formula 1, an anthracene compound represented by the following Chemical Formula 2 and a combination thereof:

(Continued)

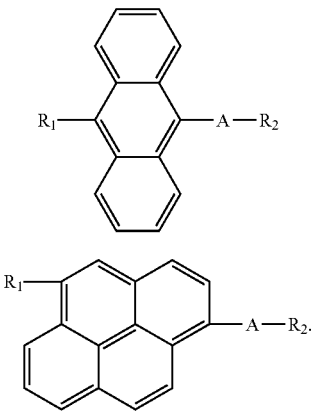

Chemical Formula 1

Chemical Formula 2

Here, the definitions of $R_1$, $R_2$ and A are as described in the specification.

12 Claims, 2 Drawing Sheets

(52) U.S. Cl.
CPC ...... *H01L 51/0072* (2013.01); *H01L 51/5072* (2013.01); *H01L 51/5096* (2013.01)

(58) Field of Classification Search
CPC ............. H01L 51/5012; H01L 51/5072; H01L 51/5096
See application file for complete search history.

(56) References Cited

U.S. PATENT DOCUMENTS

| | | | | |
|---|---|---|---|---|
| 2004/0018383 A1* | 1/2004 | Aziz | ............ | C07D 219/06 428/690 |
| 2004/0124766 A1* | 7/2004 | Nakagawa | .......... | H01L 51/0064 313/504 |
| 2004/0161633 A1* | 8/2004 | Seo | ............ | H01L 51/0052 428/690 |
| 2005/0064235 A1* | 3/2005 | Liao | ............ | H01L 51/5012 428/690 |
| 2006/0043858 A1* | 3/2006 | Ikeda | ............ | C07C 13/66 313/250 |
| 2007/0120466 A1* | 5/2007 | Arakane | ............ | C09K 11/06 313/504 |
| 2008/0193796 A1* | 8/2008 | Arakane | ............ | C09K 11/06 428/690 |
| 2009/0026929 A1* | 1/2009 | Song | ............ | H01L 51/5036 313/504 |
| 2009/0096357 A1 | 4/2009 | Lee et al. | | |
| 2009/0243473 A1* | 10/2009 | Iwakuma | ............ | H01L 51/5012 313/504 |
| 2011/0057175 A1 | 3/2011 | Kim et al. | | |
| 2011/0114974 A1 | 5/2011 | Song et al. | | |
| 2011/0121268 A1* | 5/2011 | Nagao | ............ | H01L 51/0054 257/40 |
| 2011/0156016 A1 | 6/2011 | Kawamura et al. | | |
| 2011/0278558 A1 | 11/2011 | Hamada | | |
| 2012/0256172 A1* | 10/2012 | Ito | ............ | C07D 493/04 257/40 |
| 2014/0034943 A1* | 2/2014 | Mizuki | ............ | C09K 11/06 257/40 |
| 2015/0014651 A1* | 1/2015 | Choi | ............ | H01L 51/0058 257/40 |

FOREIGN PATENT DOCUMENTS

| | | | |
|---|---|---|---|
| JP | 2009-096771 A | * | 5/2009 |
| KR | 10-2006-0074258 A | | 7/2006 |
| KR | 10-0879477 B1 | | 1/2009 |
| KR | 10-2009-0083382 A | | 8/2009 |
| KR | 20100007791 A | * | 1/2010 |
| KR | 10-2011-0027484 A | | 3/2011 |
| KR | 10-2011-0040874 A | | 4/2011 |
| KR | 10-2011-0043625 A | | 4/2011 |
| KR | 10-2011-0125861 A | | 11/2011 |
| KR | 10-2012-0071263 A | | 7/2012 |

OTHER PUBLICATIONS

Machine translation of KR 10-2012-0039325 (publication date Apr. 2012).*
Translation for JP 2009-096771 A (publication date: May 2009). (Year: 2009).*
U.S. Office Action dated Feb. 9, 2017, issued in U.S. Appl. No. 14/190,047 (9 pages).
Korean Office Action "Notification for Reason for Refusal", dated Feb. 15, 2019, for Application No. 10-2013-0075118 with corresponding English Translation, 10 pages.
English Translation of the Relevant Portion of Japanese Patent Publication JP 2007-507107 A, Mar. 22, 2007, 5 pages.
English Translation of the Relevant Portion of Korean Patent Publication KR 10-2009-0083382 A, Aug. 3, 2009, 2 pages.

* cited by examiner

ORGANIC LIGHT EMITTING DIODE DEVICE

CROSS-REFERENCE TO RELATED APPLICATION

This application claims priority to and the benefit of Korean Patent Application No. 10-2013-0075118, filed on Jun. 28, 2013, in the Korean Intellectual Property Office, the content of which is incorporated herein by reference in its entirety.

BACKGROUND

1. Field

An aspect of the present invention relates to an organic light emitting diode device.

2. Description of the Related Art

With the development of display technology, display devices are currently in wide use in not only household display devices such as TVs and monitors but also portable devices such as notebook computers, cellular phones and PMPs. As there is a demand for the display devices to be light in weight and thin in thickness, a liquid crystal display device, an organic light emitting display device, etc. has come into the spotlight as the desired display devices.

Among the display devices described above, the organic light emitting display device has a self-luminescent characteristic. In addition, the organic light emitting display device shows characteristics of low power consumption and high luminance.

SUMMARY

According to an embodiment of the present invention, an organic light emitting diode device includes: a first electrode; a second electrode facing the first electrode; an organic emission layer between the first and second electrodes; an electron transport layer between the organic emission layer and the second electrode; and a buffer layer between the organic emission layer and the electron transport layer, the buffer layer including at least one material selected from a pyrene compound represented by the following Chemical Formula 1, an anthracene compound represented by the following Chemical Formula 2 and a combination thereof:

Chemical Formula 1

Chemical Formula 2 wherein each of $R_1$ and $R_2$ is independently H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, halogen, a cyano group, a substituted or unsubstituted amino group, or a combination thereof; and A is a single bond, a substituted or unsubstituted alkylene group of C1 to C6, a substituted or unsubstituted arylene group of C6 to C30, or a combination thereof.

In Chemical Formula 1 or 2, $R_1$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, or a combination thereof; $R_2$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, a halogen atom, a cyano group, a nitro group, a hydroxy group, a carboxy group, or a combination thereof; and A may be a phenyl group, an anthracene group, a pyrene group, or a combination thereof.

The buffer layer may include one material selected from the compounds listed in the following Group 1:

Group 1

The buffer layer may include one material selected from the compounds listed in the following Group 2:

Group 2

The buffer layer may include one material selected from the compounds listed in the following Group 3:

Group 3

-continued

The buffer layer may be in direct contact with the organic emission layer.

The buffer layer may be in direct contact with the electron transport layer.

An electron injection layer may be located between the electron transport layer and the second electrode.

At least one of a hole injection layer or a hole transport layer may be further located between the organic emission layer and the first electrode.

The thickness of the buffer layer may be 10 to 100 Å.

The thickness of the electron transport layer may be 300 to 350 Å.

A method of forming an organic light emitting diode device includes forming a first electrode; forming a second electrode facing the first electrode; forming an organic emission layer between the first and second electrodes; forming an electron transport layer between the organic emission layer and the second electrode; and forming a buffer layer between the organic emission layer and the electron transport layer, the buffer layer including at least one material selected from the group consisting of a pyrene compound represented by the following Chemical Formula 1, an anthracene compound represented by the following Chemical Formula 2, and a combination thereof:

Chemical Formula 1

Chemical Formula 2 wherein each of $R_1$ and $R_2$ is independently H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, halogen, a cyano group, a substituted or unsubstituted amino group, or a combination thereof; and A is a single bond, a substituted or unsubstituted alkylene group of C1 to C6, a substituted or unsubstituted arylene group of C6 to C30, or a combination thereof.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain example embodiments of the present invention will be shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Expressions such as "at least one of," when preceding a list of elements, modify the entire list of elements and do not modify the individual elements of the list. Further, the use of "may" when describing embodiments of the present invention refers to "one or more embodiments of the present invention."

Figure 1:
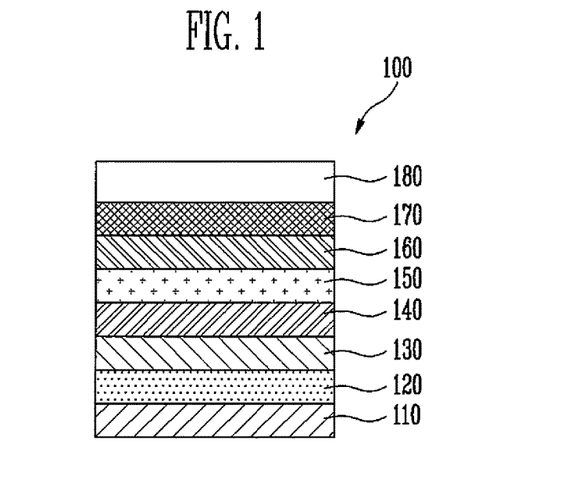
FIG. 1 is a schematic sectional view showing an organic light emitting diode device according to an embodiment of the present invention.

FIG. 1 is a sectional view schematically showing an organic light emitting diode device according to an embodiment of the present invention.

The organic light emitting diode device 100 according to this embodiment may include a first electrode 110; a second electrode 180 facing (opposite to) the first electrode; an organic emission layer 140 located between the first and second electrodes 110 and 180; an electron transport layer 160 located between the organic emission layer 140 and the second electrode 180; and a buffer layer 150 located between the organic emission layer 140 and the electron transport layer 160, the buffer layer 150 being composed of a pyrene compound represented by the following Chemical Formula 1, an anthracene compound represented by the following Chemical Formula 2 or a combination thereof:

Chemical Formula 1

Chemical Formula 2

In Chemical Formula 1 or 2, each of $R_1$ and $R_2$ is independently H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, a halogen atom, a cyano group, a substituted or unsubstituted amino group, or a combination thereof; and A is a single bond, a substituted or unsubstituted alkylene group of C1 to C6, a substituted or unsubstituted arylene group of C6 to C30, or a combination thereof.

In one embodiment, $R_1$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, or a combination thereof. In one embodiment, $R_2$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, a halogen atom, a cyano group, a nitro group, a hydroxy group, a carboxy group, or a combination thereof. In one embodiment, A may be a phenyl group, an anthracene group, a pyrene group, or a combination thereof.

The organic light emitting diode device 100 may further include a substrate formed beneath the first electrode 110. The substrate may be made of a transparent glass material using $SiO_2$ as a main component, but the present invention is not limited thereto. That is, the substrate may be formed using various materials including resins, metals, etc.

When the organic light emitting diode device is a bottom emission organic light emitting diode device in which an image is viewed from the direction of the substrate (the direction of the first electrode 110), the first electrode 110 may be a transparent electrode, and the second electrode 180 may be a reflective electrode. The first electrode 110 may be formed of ITO, IZO, ZnO or $In_2O_3$, which has a high work function. The second electrode 180 may be formed of a metal having a low work function, i.e., Ag, Mg, Al, Pt, Pd, Au, Ni, Nd, Ir, Cr, Li, or Ca.

On the contrary, when the organic light emitting diode device is a top emission organic light emitting diode device in which an image is viewed from the direction of the second electrode 180, the first electrode 110 may be a reflective electrode, and the second electrode 180 may be a transparent electrode. In this case, the reflective electrode that becomes the first electrode 110 may be made by forming a reflective layer using Ag, Mg, Al, Pt, Pd, Au, Ni, Nd, Ir, Cr, Li, Ca or a compound thereof, and then forming, on the reflective film, ITO, IZO, ZnO or $In_2O_3$ which has a low work function. The transparent electrode that becomes the second electrode 180 may be formed by depositing a metal having a low work function, i.e., Ag, Mg, Al, Pt, Pd, Au, Ni, Nd, Ir, Cr, Li, Ca or a compound thereof. Then, an auxiliary electrode layer or bus electrode line may be formed on the transparent electrode, using a transparent conductive material such as ITO, IZO, ZnO or $In_2O_3$.

When the organic light emitting diode device is a double-side emission organic light emitting diode device, both the first and second electrodes 110 and 180 may be formed as transparent electrodes.

An organic layer including a plurality of layers may be formed between the first and second electrodes 110 and 180. The organic layer may include an organic emission layer 140 configured to emit visible light, and an electron transport layer 160 including alkali metal or alkali earth metal. An electron injection layer 170 may be located between the electron transport layer 160 and the second electrode 180.

The organic emission layer 140 may be formed between the first and second electrodes 110 and 180. One or more of a hole injection layer 120 and a hole transport layer 130 may be formed between the organic emission layer 140 and the first electrode 110. For example, the hole injection layer 120 and the hole transport layer 130 may be sequentially formed on the first electrode 110, and the hole transport layer 130 may be in direct contact with the organic emission layer 140. The hole injection layer 120 and the hole transport layer 130 may be made of an organic polymer material.

The hole injection layer 120 is a layer that allows holes to be smoothly injected from the first electrode 110 to the organic emission layer 140. The hole injection layer 120 may be formed through vacuum deposition, spin coating, casting, etc. The hole injection layer 120 may be formed using various organic materials. For example, the hole injection layer 120 may be made of one or more material selected from copper phthalocyanine (CuPc), a starburst-type amine such as TCTA, m-MTDATA, or HI406 (from Idemitz Co.), Pani/DBSA(Polyaniline/Dodecylbenzenesulfonic-acid) and PEDOT/PSS(Poly(3,4-ethylenedioxythiophene)/Poly(4-styrenesulfonate). However, the present invention is not limited thereto.

The hole transport layer 130 is a layer that allows holes injected into the hole injection layer 120 to be smoothly transported to the organic emission layer 140. The hole transport layer 130 may be formed through vacuum deposition, spin coating, casting, etc. The hole transport layer 130 may be formed using various organic materials. For example, the hole transport layer 130 may be made of one or more material selected from 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N,N'-diphenylbenzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine (TFB), and poly(9,9-dioctylfluorene-co-bis-N,N',(4-butylphenyl)-bis-N,N'-phenyl-1,4-phenylenediamine (PFB). However, the present invention is not limited thereto.

The organic emission layer 140 may emit light by electrical driving of the first and second electrodes 110 and 180. The organic emission layer 140 may be made of a material that emits red light, green light or blue light. The organic emission layer 140 may be formed using a phosphorescent or fluorescent material.

The organic emission layer 140 may be formed through vacuum deposition, spin coating, casting, etc. When the organic emission layer 140 is made of a material that emits red light, the organic emission layer 140 includes a host material including CBP (carbazole biphenyl) or mCP (1,3-bis(carbazol-9-yl), and may be formed of a phosphorescent material including one or more dopants selected from PIQIr (acac)(bis(1-phenylisoquinoline)acetylacetonate iridium), PQIr (acac)(bis(1-phenylquinoline)acetylacetonate iridium), PQIr (tris(1-phenylquinoline)iridium), and PtOEP (octaethylporphyrin platinum). Alternatively, the organic emission layer 140 may be formed of a fluorescent material including PBD:Eu(DBM)3(Phen) or Perylene. However, the present invention is not limited thereto.

When the organic emission layer 140 is made of a material that emits green light, the organic emission layer 140 includes a host material including CBP or mCP, and may be formed of a phosphorescent material including a dopant such as Ir(ppy)3(fac tris(2-phenylpyridine)iridium). Alternatively, the organic emission layer 140 may be formed of a fluorescent material including Alq3 (tris(8-hydroxyquinolino)aluminum). However, the present invention is not limited thereto.

When the organic emission layer 140 is made of a material that emits blue light, the organic emission layer 140 includes a host material including CBP or mCP, and may be formed of a phosphorescent material including a dopant such as (4,6-F2 ppy)2Irpic. Alternatively, the organic emission layer 140 may be formed of a phosphorescent material including one material selected from Spiro-DPVBI, spiro-6P, distilbenzene (DSB), distyrylarylene (DSA), a PFO polymer, and a PPV polymer. However, the present invention is not limited thereto.

The electron transport layer 160 is a layer that allows electrons to be smoothly transported to the organic emission layer 140. The electron transport layer 160 may be formed through vacuum deposition, spin coating, casting, etc. The thickness of the electron transport layer 160 may be 300 to 350 Å. When the thickness of the electron transport layer 160 is less than 300 Å, the optical distance caused by the cavity effect is not harmonized, thereby lowering the emission efficiency. When the thickness of the electron transport layer 160 exceeds 350 Å, the emission efficiency may be lowered due to a reason similar to that described above. The electron transport layer 160 may also perform a function of preventing holes injected from a positive electrode from moving to the second electrode by passing through the organic emission layer 140. That is, the electron transport layer 160 may allow holes and electrons to be efficiently combined in the organic emission layer 140 by effectively preventing further movement of the holes. For example, the electron transport layer 160 may be made of one or more material selected from Alq3 (tris(8-hydroxyquinolino)aluminum), PBD, TAZ, Spiro-PBD, BAlq, and SAlq. However, the present invention is not limited thereto.

An electron injection layer 170 may be formed between the electron transport layer 160 and the second electrode 180 so that electrons are smoothly injected into the organic emission layer 140. The electron injection layer 170 may be formed through vacuum deposition, spin coating, casting, etc. In one embodiment, the electron injection layer 170 is made of a material selected from $BaF_2$, LiF, NaCl, CsF, $Li_2O$, BaO and Liq.

The hole injection layer 120, the hole transport layer 130, the organic emission layer 140, the electron transport layer 160 and the electron injection layer 170, which are sequentially formed between the first and second electrodes 110 and 180, may be organic layers made of a polymeric organic material. The hole transport layer 130 may be formed in the direction of the first electrode 110 about the organic emission layer 140, using poly-(2,4)-ethylene-dihydroxy thiophene (PEDOT), polyaniline (PANI), etc. In this case, the hole transport layer 130 may be formed on the hole injection layer 120 through inkjet printing or spin coating. The organic emission layer 140 may be formed using PPV, soluble PPVs, cyano-PPV, polyfluorene, etc., and a color pattern may be formed using inkjet printing, spin coating, thermal transfer using laser, etc.

The organic light emitting diode device 100 according to this embodiment may further include a buffer layer 150 located between the electron transport layer 160 and the organic emission layer 140. The buffer layer 150 is provided as a separate layer from the electron transport layer 160. For example, the buffer layer 150 may be made of at least one material selected from a pyrene compound represented by the following Chemical Formula 1, an anthracene compound represented by the following Chemical Formula 2, and a combination thereof:

Chemical Formula 1

Chemical Formula 2

In Chemical Formula 1 or 2, each of $R_1$ and $R_2$ is independently H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, a halogen atom, a cyano group, a substituted or unsubstituted amino group, or a combination thereof; and A is a single bond, a substituted or unsubstituted alkylene group of C1 to C6, a substituted or unsubstituted arylene group of C6 to C30, or a combination thereof.

In one embodiment, $R_1$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, or a combination thereof. In one embodiment, $R_2$ may be a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, a halogen atom, a cyano group, a nitro group, a hydroxy group, a carboxy group, or a combination thereof. In one embodiment, A may be a phenyl group, an anthracene group, a pyrene group, or a combination thereof.

Also, the buffer layer 150 may be made of one material selected from the compounds listed in the following Group 1:

Group 1

In addition, the buffer layer 150 may be made of one material selected from the compounds listed in the following Group 2:

Group 2

In one embodiment, the buffer layer 150 may be made of one material selected from the compounds listed in the following Group 3:

Group 3

The buffer layer 150 (between the electron transport layer 160 and the organic emission layer 140) can improve the movement speed of electrons from the electron transport layer 160 to the organic emission layer 140. The buffer layer 150 may be in direct contact with the organic emission layer 140. Alternatively, the buffer layer 150 may be in direct contact with the electron transport layer 160. In one embodiment, the buffer layer is in direct contact with both the organic emission layer 140 and the electron transport layer 160.

Generally, in an organic light emitting diode device, characteristics of an organic emission layer and the other layers, which are formed between the first and second electrodes constituting the organic light emitting diode device, are influenced by the property of the polymer material forming each of the layers. In the organic light emitting diode device, electrons generated in the second electrode are transferred to the organic emission layer through an electron injection layer and an electron transport layer. In this case, the movement speed of the electrons is slower than the speed at which holes generated in the second electrode are transferred to the organic emission layer. As such, the ratio (rate) of combination between electrons and holes in the organic emission layer is low (i.e., there are less electrons to be combined with the holes in the organic emission layer), thereby lowering the emission efficiency. Further, the energy bandgap between the organic emission layer and the electron transport layer in direct contact with the organic emission layer is not harmonized, and therefore, electrons are not easily injected from the electron transport layer to the organic emission layer.

The organic light emitting diode device according to this embodiment further includes the buffer layer located between the electron transport layer and the organic emission layer. The buffer layer may be formed of a material represented by Chemical Formula 1, Chemical Formula 2, or a combination thereof. The buffer layer can increase the movement speed of the electrons to correspond to the movement speed of the holes. The energy bandgap of the buffer layer is more harmonized with that of the organic emission layer, as compared with that of the electron transport layer, thereby facilitating the injection of the electrons into the organic emission layer.

The thickness of the buffer layer 150 may be 10 to 100 Å when considering the movement speed of the electrons and the characteristic revelation of the buffer layer. When the thickness of the buffer layer 150 is less than 10 Å, the thickness of the buffer layer 150 is too small, and therefore, characteristics of the buffer layer 150 are not shown. When the thickness of the buffer layer 150 exceeds 100 Å, the thickness of the buffer layer 150 may act as a barrier that decreases the movement speed of the electrons to the organic emission layer.

Hereinafter, embodiments of the present invention and comparative examples are described. However, the following embodiments are merely embodiments of the present invention, and the scope of the present invention is not limited to the following embodiments.

Embodiment 1

A first electrode was deposited to a thickness of 500 Å on a patterned glass substrate, using ITO as a positive electrode of the first electrode. A hole injection layer using CuPc was deposited to a thickness of 1000 Å. A hole transport layer using NPD was deposited to a thickness of 1000 Å. An organic emission layer was deposited to a thickness of 300 Å, using (4.6-F2 ppy)2Irpic as a dopant (the doping concentration of the dopant is 2 wt %) in a host material composed of CBP as a blue emission layer of the organic emission layer. Next, a buffer layer was deposited to a thickness of 20 Å, using a material represented by Chemical Formula A1 in the following Group 3. An electron transport layer using spiro-PBD was deposited to a thickness of 200

Å. An electron injection layer using LiF was deposited to a thickness of 10 Å. A second electrode was deposited to a thickness of 1000 Å, using Al as a negative electrode of the second electrode, thereby manufacturing an organic light emitting diode device.

Comparative Example 1

An organic light emitting diode device was manufactured under the same condition as Embodiment 1, except the buffer layer was formed using 2,9-dimethyl-4,7-diphenyl-1, 10-phenanthroline (bathocuproin; BCP).

Embodiment 2

An organic light emitting diode device was manufactured under the same condition as Embodiment 1, using Chemical Formula A2 in the following Group 3 as a material of the buffer layer.

Embodiment 3

An organic light emitting diode device was manufactured under the same condition as Embodiment 1, using Chemical Formula A3 in the following Group 3 as a material of the buffer layer.

Embodiment 4

An organic light emitting diode device was manufactured under the same condition as Embodiment 1, using Chemical Formula A4 in the following Group 3 as a material of the buffer layer.

Embodiment 5

An organic light emitting diode device was manufactured under the same condition as Embodiment 1, using Chemical Formula A5 in the following Group 3 as a material of the buffer layer.

Embodiment 6

An organic light emitting diode device was manufactured under the same condition as Embodiment 1, using Chemical Formula A6 in the following Group 3 as a material of the buffer layer.

[A1]

[A2]

[A3]

[A4]

[A5]

-continued

[A6]

[A7]

Driving voltages (V), current densities (mA/cm$^2$), luminances (Cd/A), power efficiencies (lm/W), color coordinates and efficiencies of the organic light emitting diode devices manufactured according to Embodiments (Embodiments 1 to 6) and Comparative Example 1 were measured and shown in the following Table 1.

Figure 2:
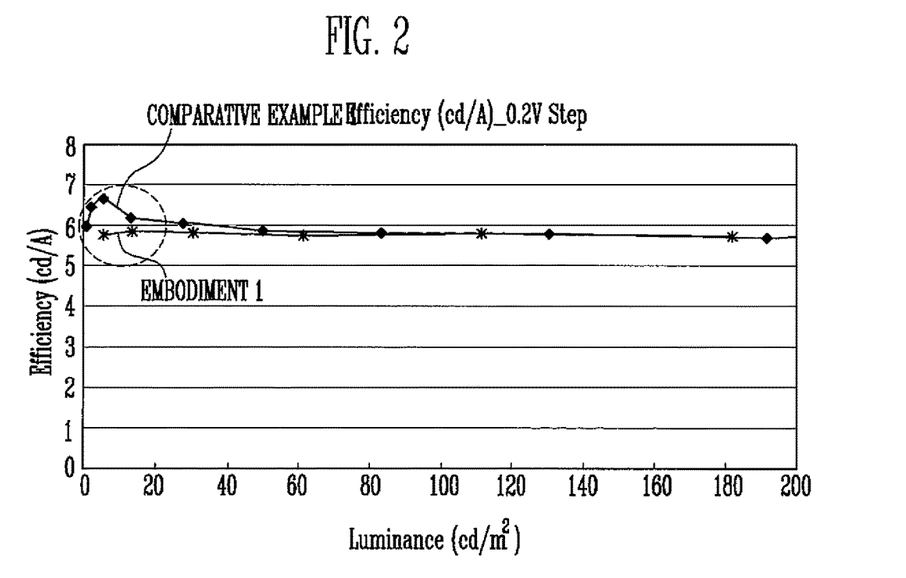
FIG. 2 is a graph showing efficiencies with respect to luminance of Embodiment 1 and Comparative Example 1.
Figure 3:
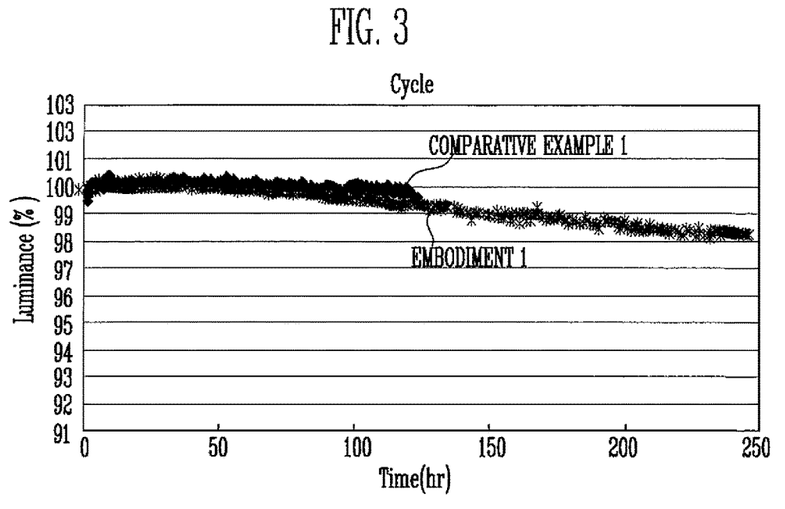
FIG. 3 is a graph showing lifetime characteristics of Embodiment 1 and Comparative Example 1.

FIG. 2 is a graph showing efficiencies with respect to luminances of Embodiment 1 and Comparative Example 1. FIG. 3 is a graph showing lifetime characteristics of Embodiment 1 and Comparative Example 1.

has a maximum value of 6.8 Cd/A in the low-current region. Therefore, it can be observed that the efficiency of luminance is not a constant, and a peculiar region is formed. On the other hand, in Embodiments 1 to 6, it can be observed that the maximum and average values of luminance are almost constant when the luminance value is rounded off to two decimal places. That is, in Comparative Example 1, a region in which the luminance value in the low-current region is relatively greater than the average value of luminance is formed. On the other hand, in Embodiments 1 to 6, the efficiency curve of luminance is not changed and is constant or substantially constant even in the low-current region.

FIG. 2 is a graph showing efficiency as a function of luminance of Embodiment 1 and Comparative Example 1. It can be observed that the organic light emitting diode device manufactured according to Embodiment 1 has excellent efficiency of luminance, as compared with the organic light emitting diode device manufactured according to Comparative Example 1. Referring to FIG. 3, it can be observed that the organic fight emitting diode device manufactured according to embodiments of the present invention has a lifetime (lifespan) characteristic similar to that of the organic fight emitting diode device manufactured according to Comparative Example 1.

That is, in the organic light emitting diode device according to the embodiments of the present invention, the injection of electrons from the buffer layer to the organic emission layer is easily performed, and the efficiency curve in the low-current region is improved. Also, the color change in a low-gray-scale region of an RGB panel introducing such a structure is improved.

This results from the fact that Chemical Formulas A1 to A6 in Group 3 are used in the buffer layers according to Embodiments 1 to 6. This is because, in the buffer layers of Embodiments 1 to 6, the movement speed of electrons is increased as compared with that in the buffer layer of Comparative Example 1, and thus the ratio of combination between electrons and holes is increased. The energy bands of the buffer layers of Embodiments 1 to 6 are matched to that of the organic emission layer, as compared with that in

TABLE 1

| | Driving voltage (V) | Current density (mA/cm$^2$) | Luminance (Cd/A) Maximum value | Luminance (Cd/A) Minimum value | Power efficiency (lm/W) | Color coordinate CIE_x | Color coordinate CIE_y | Efficiency |
|---|---|---|---|---|---|---|---|---|
| Comparative Example 1 | 4.9 | 11.7 | 6.8 | 5.7 | 3.6 | 0.138 | 0.051 | 111.8 |
| Embodiment 1 | 4.9 | 11.3 | 5.7 | 5.7 | 3.7 | 0.138 | 0.049 | 115.6 |
| Embodiment 2 | 4.8 | 11.5 | 5.5 | 5.5 | 4.2 | 0.142 | 0.043 | 127.3 |
| Embodiment 3 | 4.8 | 12 | 4.5 | 4.5 | 2.8 | 0.143 | 0.040 | 113.7 |
| Embodiment 4 | 4.9 | 11.2 | 5.6 | 5.6 | 3.8 | 0.138 | 0.048 | 116 |
| Embodiment 5 | 4.7 | 11.6 | 4.6 | 4.6 | 2.9 | 0.145 | 0.039 | 117.9 |
| Embodiment 6 | 4.9 | 11 | 5.6 | 5.6 | 3.6 | 0.138 | 0.049 | 114.3 |

Referring to Table 1, it can be observed that the driving voltages, current densities, power efficiencies, color coordinates and efficiencies of the organic light emitting diode devices manufactured according to Embodiments 1 to 6 are all similar to those of Comparative Example 1. In Comparative Example 1, the efficiency curve in a low-current region is not a constant but is changed, and therefore, the average value of luminance of Comparative Example 1 is 5.7 Cd/A. However, the luminance value of Comparative Example 1

Comparative Example 1. Thus, the injection of electrons is easily performed, so that the characteristic of the organic light emitting diode device in the low-current region can be improved.

As described above, according to embodiments of the present invention, the organic light emitting diode device has a new buffer layer, so that it is possible to facilitate the injection of electrons and to improve the driving characteristic and lifespan of the organic light emitting diode device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and equivalents thereof.

What is claimed is:

1. An organic light emitting diode device, comprising:
a first electrode;
a second electrode facing the first electrode;
an organic emission layer between the first and second electrodes and comprising a host material;
an electron transport layer between the organic emission layer and the second electrode; and
a buffer layer between the organic emission layer and the electron transport layer, the buffer layer consisting of at least one material represented by Chemical Formula 1:

Chemical Formula 1 wherein $R_1$ is H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, halogen, a cyano group, a substituted or unsubstituted amino group, or a combination thereof;
$R_2$ is a substituted or unsubstituted heteroaryl group of C4 to C30;
A is a substituted or unsubstituted pyrene group; and
wherein the at least one material represented by Chemical Formula 1 consisted in the buffer layer is different from the host material comprised in the organic emission layer.

2. The organic light emitting diode device of claim 1, wherein, in Chemical Formula 1, $R_1$ is a substituted or unsubstituted phenyl group, a substituted or unsubstituted naphthyl group, a substituted or unsubstituted biphenyl group, a substituted or unsubstituted terphenyl group, a substituted or unsubstituted anthracene group, a substituted or unsubstituted fluorenyl group, a substituted or unsubstituted carbazolyl group, a substituted or unsubstituted pyridine group, or a combination thereof; and
$R_2$ is a substituted or unsubstituted carbazolyl group, a substituted or unsubstituted pyridine group, or a combination thereof.

3. An organic light emitting diode device, comprising:
a first electrode;
a second electrode facing the first electrode;
an organic emission layer between the first and second electrodes and comprising a host material;
an electron transport layer between the organic emission layer and the second electrode; and
a buffer layer between the organic emission layer and the electron transport layer, the buffer layer consisting of a material selected from compounds listed in following Group 1:

Group 1 wherein the material selected from the compounds listed in Group 1 is different from the host material comprised in the organic emission layer.

4. An organic light emitting diode device, comprising:
a first electrode;
a second electrode facing the first electrode;
an organic emission layer between the first and second electrodes and comprising a host material;
an electron transport layer between the organic emission layer and the second electrode; and
a buffer layer between the organic emission layer and the electron transport layer, the buffer layer consisting of a material selected from compounds listed in following Group 2:

Group 2 wherein the material selected from the compounds listed in Group 2 is different from the host material comprised in the organic emission layer.

5. The organic light emitting diode device of claim 1, wherein the buffer layer comprises a material selected from compounds listed in the following Group 3:

Group 3

-continued

6. The organic light emitting diode device of claim 1, wherein the buffer layer is in direct contact with the organic emission layer.

7. The organic light emitting diode device of claim 1, wherein the buffer layer is in direct contact with the electron transport layer.

8. The organic light emitting diode device of claim 1, further comprising:
an electron injection layer between the electron transport layer and the second electrode.

9. The organic light emitting diode device of claim 1, further comprising at least one selected from the group consisting of
a hole injection layer and a hole transport layer between the organic emission layer and the first electrode.

10. The organic light emitting diode device of claim 1, wherein a thickness of the buffer layer is 10 to 100 Å.

11. The organic light emitting diode device of claim 1, wherein a thickness of the electron transport layer is 300 to 350 Å.

12. A method of forming an organic light emitting diode device, the method comprising:
forming a first electrode;
forming a second electrode facing the first electrode;
forming an organic emission layer between the first and second electrodes, the organic emission layer comprising a host material;
forming an electron transport layer between the organic emission layer and the second electrode; and
forming a buffer layer between the organic emission layer and the electron transport layer, the buffer layer consisting of at least one material represented by following Chemical Formula 1:

Chemical Formula 1 wherein $R_1$ is H, a substituted or unsubstituted alkyl group of C1 to C30, a substituted or unsubstituted alkoxy group of C1 to C30, a substituted or unsubstituted aryl group of C6 to C30, a substituted or unsubstituted aryloxy group of C6 to C30, a substituted or unsubstituted heteroaryl group of C4 to C30, a substituted or unsubstituted condensed multi-ring group of C6 to C30, a hydroxyl group, halogen, a cyano group, a substituted or unsubstituted amino group, or a combination thereof;

$R_2$ is a substituted or unsubstituted heteroaryl group of C4 to C30;

A is a substituted or unsubstituted pyrene group; and wherein the at least one material represented by Chemical Formula 1 consisted in the buffer layer is different from the host material comprised in the organic emission layer.

* * * * *